United States Patent [19]

Pan

[11] Patent Number: 4,874,493
[45] Date of Patent: Oct. 17, 1989

[54] METHOD OF DEPOSITION OF METAL INTO CAVITIES ON A SUBSTRATE

[75] Inventor: Ju-Don T. Pan, Austin, Tex.

[73] Assignee: Microelectronics and Computer Technology Corporation, Austin, Tex.

[21] Appl. No.: 174,054

[22] Filed: Mar. 28, 1988

[51] Int. Cl.⁴ .................. C23C 14/46; H01L 21/88
[52] U.S. Cl. ...................... 204/192.11; 156/643; 204/192.3; 204/192.34; 437/228
[58] Field of Search .......... 204/192.3, 192.11, 192.34; 156/643; 437/228, 245, 246

[56] References Cited

U.S. PATENT DOCUMENTS

| | | | |
|---|---|---|---|
| 3,983,022 | 9/1976 | Auyang et al. | 204/192 |
| 4,248,688 | 2/1981 | Gartner et al. | 204/192 E |
| 4,460,434 | 7/1984 | Johnson et al. | 156/643 |
| 4,560,577 | 12/1985 | Mirtich et al. | 427/38 |
| 4,714,520 | 12/1987 | Gwozdz | 437/228 |
| 4,717,462 | 1/1988 | Homma et al. | 204/298 |
| 4,721,689 | 1/1988 | Chaloux, Jr. et al. | 437/189 |
| 4,756,810 | 7/1988 | Lamont, Jr. et al. | 204/192.3 |

FOREIGN PATENT DOCUMENTS 59-170270  9/1984  Japan .................................. 204/298

OTHER PUBLICATIONS

Brian Chapman, Glow Discharge Processes, John Wiley & Sons, New York, 1980, pp. 272–275.

Primary Examiner—John F. Niebling
Assistant Examiner—William Leader
Attorney, Agent, or Firm—Fulbright & Jaworski

[57] ABSTRACT

A process for filling cavities in a flat surface on a substrate by metal deposition which includes depositing a film of metal onto the flat surface and cavities in a substantially perpendicular direction to the surface, and simultaneously re-sputtering and deposited film on the flat surface by ion beam milling at an angle to the surface of the substrate for achieving the deposition of metal into the cavities and filling the cavities without leaving any film on the flat surface.

6 Claims, 3 Drawing Sheets

METHOD OF DEPOSITION OF METAL INTO CAVITIES ON A SUBSTRATE

BACKGROUND OF THE INVENTION

It is desirable to fill cavities, such as vias, trenches, and line patterns in an otherwise flat microelectronic substrate or integrated circuits. However, in coating the surface of the substrate with a metal film by such processes as evaporation, ion beam deposition, or sputtering, one serious problem arises. Self-shadowing of the deposited material results in a cavity being enclosed inside the cavity to be filled. This enclosed cavity will trap process chemicals and cause a serious reliability problem. This problem is especially serious for a cavity with a high aspect ratio that is common among today's microelectronics.

The present invention is directed to a process for depositing metal into and substantially filling the cavities on the flat surface of a substrate without leaving any film deposited on the flat surface. The present process is applicable to fill vias, and line patterns in substrate or integrated circuit processing. For example, the process can be used to build a coaxial conductor into a substrate by providing a line pattern in a cavity etched into a dielectric layer and alternating layers of conductor and dielectric can be deposited to build a coaxial conductor.

SUMMARY

The present invention is directed to a process for the deposition of a metal into cavities in a substantially flat surface of a substrate by depositing a film of metal on the surface of the substrate, and simultaneously removing the film deposited outside the cavity by ion beam milling.

Still a further object of the present invention is wherein the re-sputtering inside the cavity will rearrange the material inside the cavity such that no enclosed cavity will be left behind when the cavity is filled by this process.

Yet a still further object of the present invention is wherein the deposition of the film includes ion beam deposition.

Still a further object of the present invention is wherein the direction of depositing the film of metal is substantially perpendicular to the surface of the substrate and wherein the re-sputtering of the deposited film is performed by directing the ion beam milling at an angle to the surface of the substrate. For example, the angle to the surface of the substrate of the ion beam milling may be approximately 45°.

Still a further object of the present invention is wherein re-sputtering the deposited film by ion beam milling removes the deposited film from the flat surfaces.

Other and further objects, features and advantages will be apparent from the following description of a presently preferred embodiment of the invention, given for the purpose of disclosure, and taken in conjunction with the accompanying drawings.

DESCRIPTION OF THE PREFERRED EMBODIMENT

While the present invention will be described, for purposes of illustration only, as filling a via in a flat surface of a microelectronic substrate without leaving any film deposition on the flat surface, the present method is applicable to the deposition of a metal film into other non-planar surfaces of a substrate such as trenches and lines.

Figures 1A, 1B:
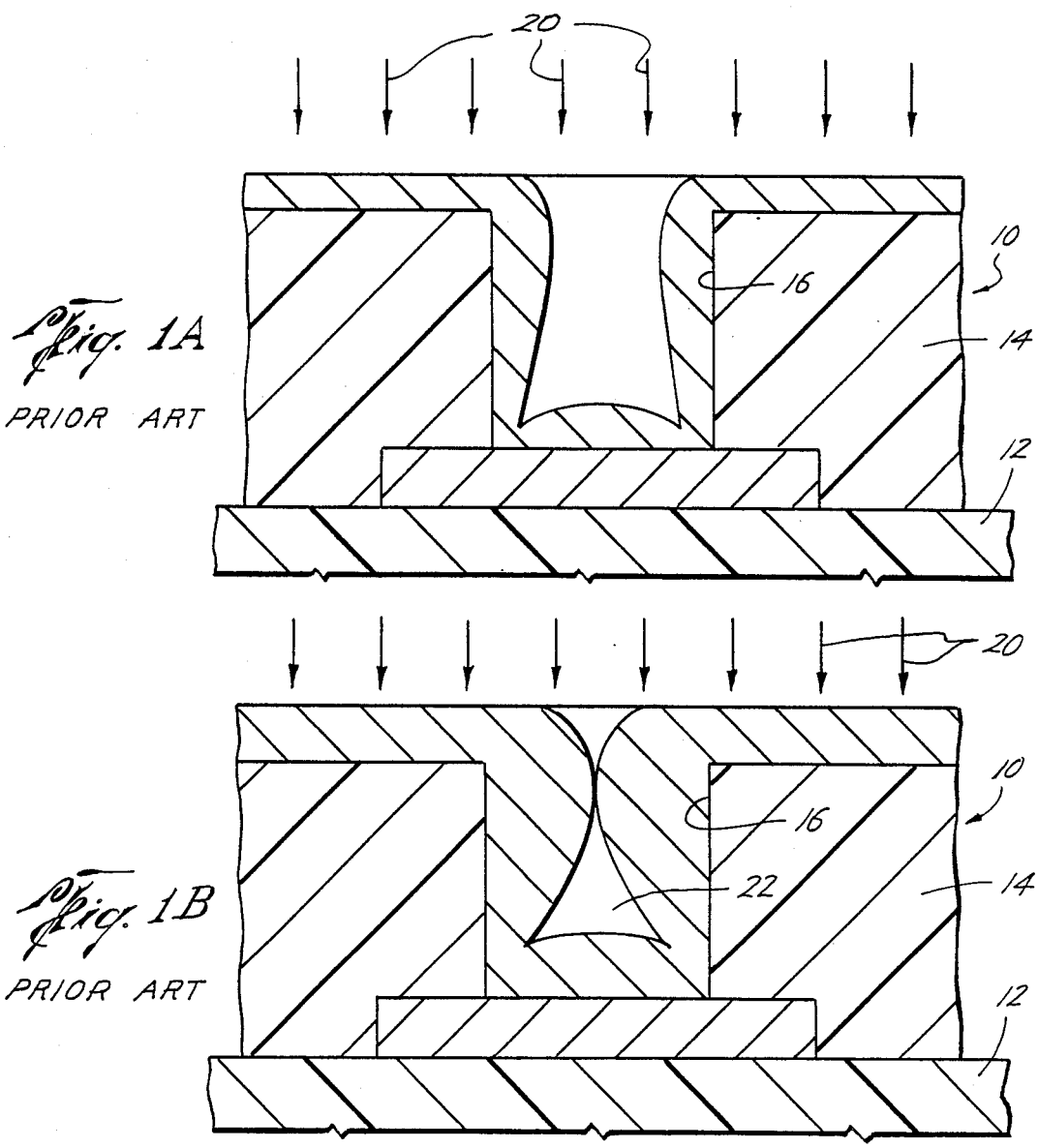
FIG. 1A is an enlarged fragmentary cross-sectional view illustrating the disadvantages of attempting to fill a via by depositing a film of metal on the surface.
FIG. 1B is a view similar to FIG. 1A illustrating the disadvantages of the further step of depositing more of the metal film and the creation of an enclosed cavity.

Referring now to the drawings, and particularly to FIG. 1A, a microelectric substrate generally indicated by the reference numeral 10 is shown having a conventional plated pad 12, and a dielectric 14 thereon having a via 16 therein. In the step of building up the substrate, it is desirable to fill the via 16 with a metal, such as copper or aluminum, and then proceed with adding additional interconnecting layers on the substrate.

While it would be desirable to deposit metal into the via 16 by a process of ion beam deposition, evaporation, or sputtering, such a process has one serious disadvantage. As shown in FIG. 1A, a film of metal is being deposited by the arrows 20 and begins to coat the top of the insulation 14 as well as to begin to fill the via 16. As the process continues, as best seen in FIG. 1B, the amount of coating increases on the insulation 14 and also increases in the via 16. However, self-shadowing of the process leads to a void or cavity 22 being created in the via 16 creating an electrical weak spot and a reliability problem in the finished via.

The present invention is directed to the deposition of a metal into cavities such as vias, trenches or line patterns into an otherwise flat microelectronic substrate for the purpose of substantially filling the cavities without leaving any film deposition on the flat surface.

Figure 2:
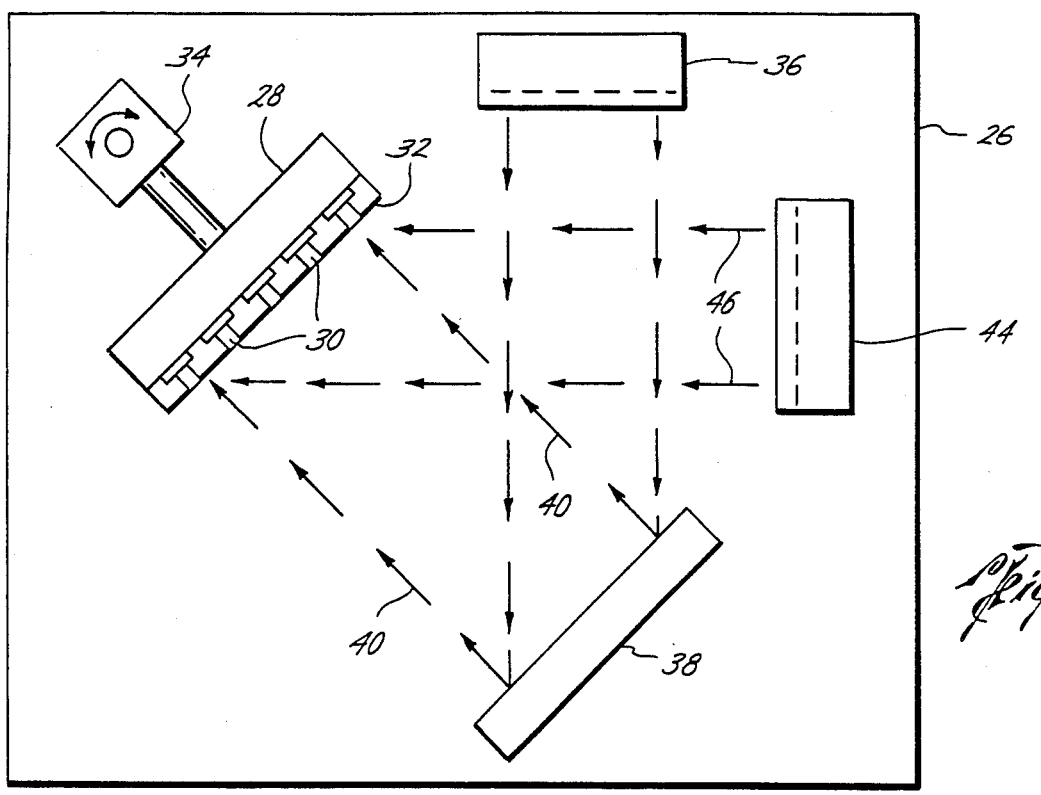
FIG. 2 is a schematic elevational view illustrating the process of the present invention.
Figure 3A:
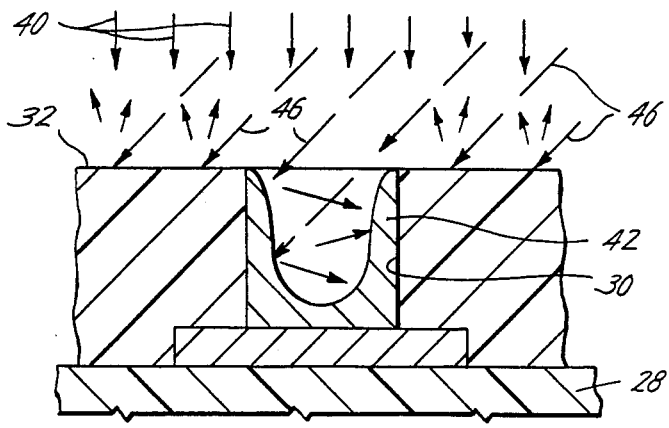
FIG. 3A is an enlarged fragmentary cross-sectional view of a substrate having a cavity therein in which a metal film is being deposited on the surface while simultaneously the deposited film outside the cavity is being re-sputtered by ion beam milling.
Figure 3B:
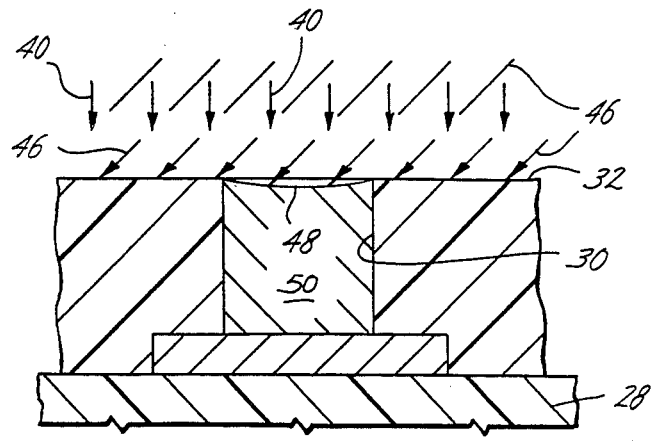
FIG. 3B is a view similar to FIG. 3A showing the completion of the depositing and milling process of the present invention.

Referring now to FIG. 2, a process chamber 26 is shown having a substrate 28 having cavities such as a plurality of vias 30 in a flat surface 32 which is held by a suitable support 34. A first means for depositing a film of metal in the vias 30 and surface 32 is provided such as a primary ion beam means 36 which directs ion beams to a target 38 such as copper or aluminum thereby causing the copper or aluminum material 40 to be sputtered toward and be deposited into the cavities 30 and on the surface 32 in a direction generally perpendicular to the surface 32. Of course, other means for providing a deposit of a metal film on the surface 32 may be used such as evaporation or sputtering. This step of depositing a film of metal is generally indicated in FIG. 3A wherein the sputtered material 40 deposits a film 42 on the flat surface 32 as well as in the via 30. However, as best seen in FIG. 2, a secondary ion beam means 44 is provided to direct ion beams 46, at an angle, against the flat surface 32 and vias 30 to act as ion beam milling of the flat surface 32 and substantially filling the vias 30 by re-sputtering the deposition 42 (FIG. 3A) thereby removing the film 42 from the flat surfaces 32 (FIG. 3B). The re-sputtering of the material which was deposited inside the via will be redistributed and stay inside the via to fill the via. The redistribution also eliminates the self-shadowing effect which is a common problem with other deposition techniques. The result, as best seen in FIG. 3B, is that the via 30 is substantially filled with only a small dip 48 at the top and the flat surfaces 32 are free of the metal film disposition. One suitable piece of equipment 26 for performing the above-named process is Model No. 1160 sold by Commonwealth Scientific Corporation.

Preferably, the re-sputtering by the ion beam means 44 is performed simultaneously with the depositing of the film by the action of the ion beam means 36. However, the action of the primary ion beam depositing means 36 and the secondary ion beam milling means 44 could be accomplished alternately. Preferably, the secondary ion beam means 44 directs the ion beams at an angle, such as 45 degrees, whereby the natural faceting tends to create a final surface substantially parallel to the original substrate surface 32. By controlling the deposition rate and re-sputtering rate, filling of cavities 30 in the substrate is achievable.

Figure 3C:
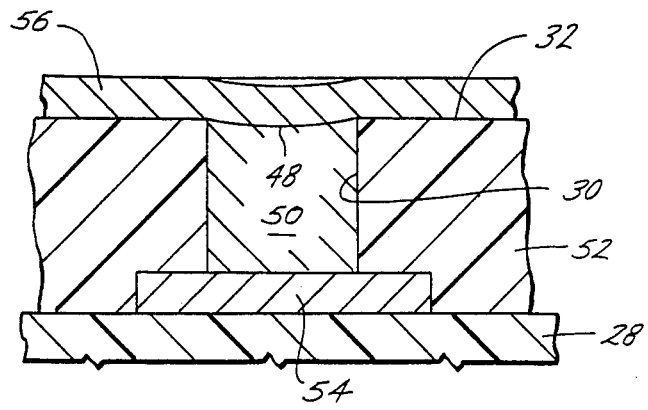
FIG. 3C is a view similar to FIG. 3B with the addition of one type of an electrical interconnect connecting to the completed via.

The present invention is applicable to filling various cavities, such as vias, trenches and line patterns in substrate processing, and can be used in combination with other processes for building up multiple layers, such as reference planes, X-lines, and Y-lines in substrate processing. For example, referring to FIG. 3C in which a substrate 28, such as silicon or ceramic, includes an insulation 52 such as silicon oxide or polymide, a via 50 has been deposited by the process of the present invention and may consist of any suitable metal, such as copper or aluminum, which is deposited on a metal base 54, such as copper or aluminum. Thereafter, another layer of metal 56 may be deposited over the via 50, such as by a conventional process of providing a photo-resist, metal plating and photo-resist stripping to form a Y-line. It is to be noted that the conductor 56 will be deposited on the via 50 at the curved intersection or dip 48 to provide a via without cavities or voids and therefore one without electric defects and reliability problems.

Figure 3D:
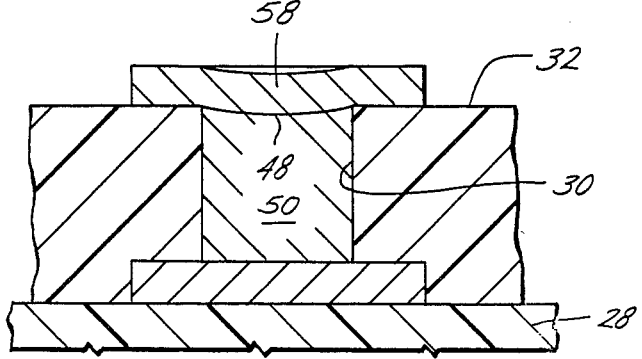
FIG. 3D is a view similar to FIG. 3B with the addition of another type of electrical interconnect connected to the completed via.

Similarly, and referring to FIG. 3D, another layer of metal 58 may be deposited over the via 50, such as by a conventional process of providing a photo-resist, metal plating, and photo-resist stripping to form an X-line.

Figure 4:
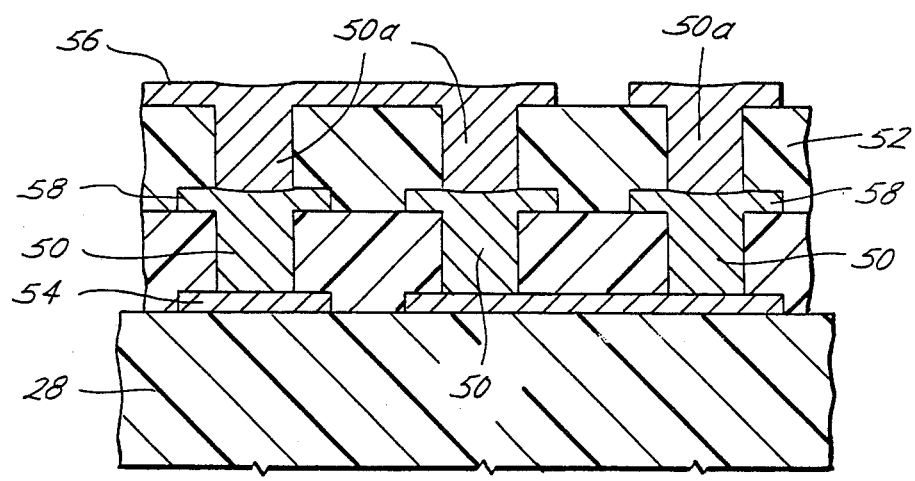
FIG. 4 is a cross-sectional view of a substrate which has been built up into several layers using the process of the present invention.

Referring to FIG. 4, the substrate may be built up with additional layers of interconnecting lines by again depositing by the process of the present invention vias 50a on top of the metals base 54 on which additional interconnecting layers may be provided for providing other signal lines as Y-signal line 56, and X-signal lines 58.

The present invention, therefore, is well adapted to carry out the objects and attain the ends and advantages mentioned as well as others inherent therein. While a presently preferred embodiment of the invention has been given for the purpose of disclosure, numerous changes in the details of construction and arrangement of steps of the process will be readily apparent to those skilled in the art and which are encompassed within the spirit of the invention and the scope of the appended claims.

What is claimed is:

1. A process for achieving the deposition of a metal into cavities in a substantially flat surface of a substrate and substantially filling the cavities without leaving enclosed holes comprising,
   depositing metal in the cavities and on the surface of the substrate by ion beam sputter deposition, and
   simultaneously re-sputtering the deposited metal on the flat surface by ion beam milling thereby substantially completely removing the film on the flat surface without removing the metal deposited in the cavities.

2. The process of claim 1 wherein the direction of depositing the metal is substantially perpendicular to the surface of the substrate.

3. The process of claim 1 wherein the re-sputtering of the deposited metal is performed by directing the ion beam milling at an angle to the surface of the substrate.

4. The process of claim 3 wherein the angle is approximately 45 degrees.

5. A process for achieving the deposition of a metal into cavities in a substantially flat surface of a substrate and substantially filling the cavities without leaving enclosed holes comprising,
   depositing metal in the cavities and on the surface of the substrate by ion beam sputter deposition,
   re-sputtering the deposited film on the flat surface by ion beam milling thereby substantially completely removing the film on the flat surface without removing the metal deposited in the cavities, and
   alternately repeating the depositing and re-sputtering steps until sufficient metal has been deposited to substantially fill the cavities without leaving enclosed holes.

6. A process for filling cavities in a substantially flat surface on a substrate by metal deposition comprising,
   depositing metal onto the flat surface and cavities in a substantially perpendicular direction to the surface, and
   simultaneously re-sputtering the deposited metal on the surface by ion beam milling at an angle to the surface of the substrate for preserving the deposition of metal inside the cavities, and substantially completely removing the film on the flat surface.

* * * * *